United States Patent [19]

Tohyama et al.

[11] Patent Number: 5,364,284
[45] Date of Patent: Nov. 15, 1994

[54] SOCKET

[75] Inventors: Masao Tohyama, Gotenba; Kiyokazu Ikeya, Shizuoka, both of Japan

[73] Assignee: Texas Instruments Incorporated, Dallas, Tex.

[21] Appl. No.: 88,234

[22] Filed: Jul. 6, 1993

[30] Foreign Application Priority Data

Jul. 16, 1992 [JP] Japan .................. 4-212001

[51] Int. Cl.⁵ .................................... H01R 11/22
[52] U.S. Cl. ............................ 439/266; 439/331
[58] Field of Search .............. 439/70, 71, 72, 73, 439/264, 265, 266, 268, 330, 331, 525, 526

[56] References Cited

U.S. PATENT DOCUMENTS

| | | |
|---|---|---|
| 4,175,823 | 12/1987 | Ezura et al. |
| 4,993,955 | 2/1991 | Sauant ............... 439/331 X |
| 5,139,437 | 8/1992 | Ikeya et al. ............... 439/331 X |
| 5,147,212 | 9/1992 | Uratsuji et al. |
| 5,228,866 | 7/1993 | Espenshade et al. ............... 439/266 |

*Primary Examiner*—Khiem Nguyen
*Attorney, Agent, or Firm*—Russell E. Baumann; Richard L. Donaldson; René Grossman

[57] ABSTRACT

A socket having contact elements (22, 22', 50, 89) movable into and out of engagement with terminal leads (14a, 87) of an electrical component has a connection assembly (28, 34; 28', 34'; 58, 60, 66; 90, 91, 95) rotatably mounted to the base (10, 52, 80) of the socket for moving the contact elements into and out of engagement with the terminal leads. The connection assembly is driven by a movable cover (12) or by a motor (46) through a shaft (26, 54) which may be interconnected with comparable shafts on other sockets.

15 Claims, 8 Drawing Sheets

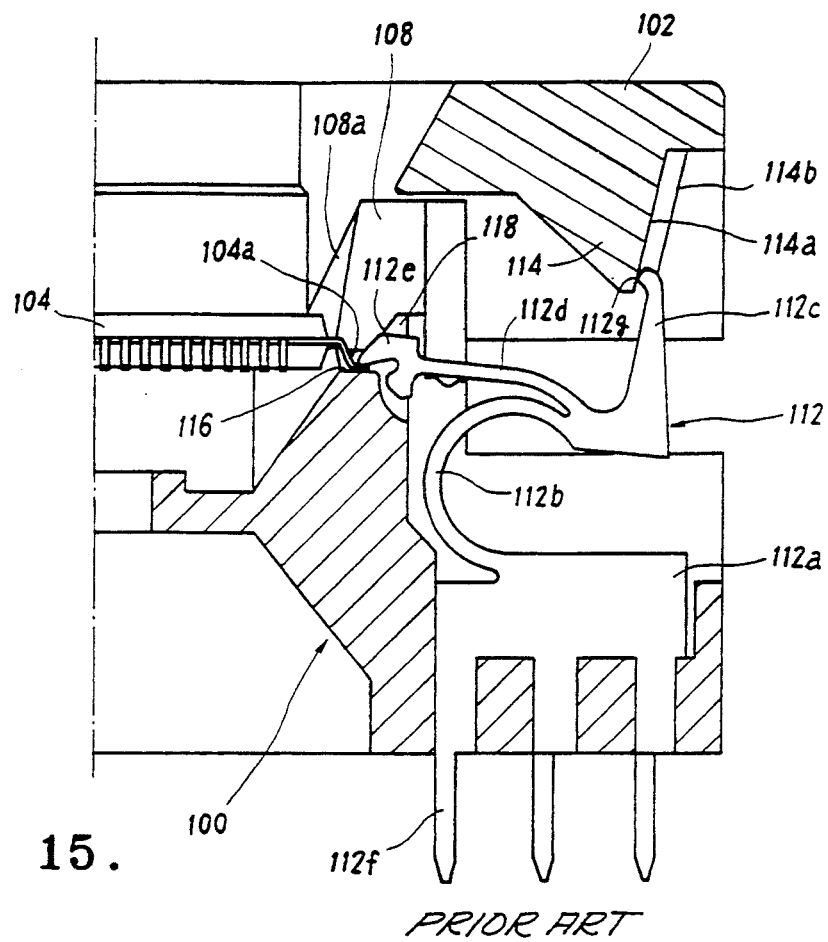
FIG. 15. *PRIOR ART*
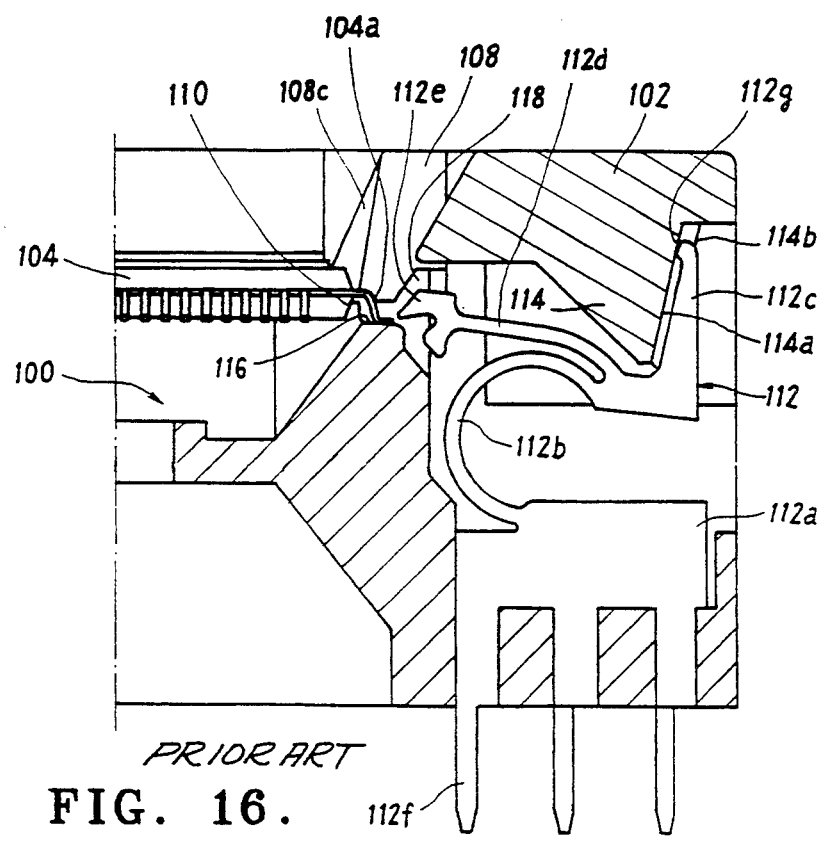
FIG. 16. *PRIOR ART*

SOCKET

BACKGROUND OF THE INVENTION

This invention relates to a socket having contact elements which in connection with mounting and removal of an IC package (electrical part and/or semiconducting integrated circuit), an electrical connection is made with this IC package.

Typically, at a semiconductor manufacturing plant, before shipping IC packages, in which semiconductor integrated circuit chips are resin-sealed, they are put through a reliability test which is called burn-in, in order to discriminate between good and defective units. Burn-in consists of operating the IC packages, which have passed functional tests for a certain amount of time at a high temperature of 120° C. and at a source voltage which is higher than the rated value by about 20%. The IC packages which have operation failures during burn-in are discarded as defective units, and the IC packages which continue operating normally are shipped out as good items.

The construction of a conventional prior art socket which has been used for mounting IC packages during such burn-in is shown in FIGS. 13–16. FIGS. 13 and 14 are a plan view, and a side view, respectively, of the conventional socket, and FIGS. 15 and 16 are enlarged partial cross-sectional views of this conventional socket.

As shown in FIG. 14, this socket is made up of a base 100, serving as the socket main body, which is affixed to a printed-circuit board (not shown in the figure ), and a cover 102 which is provided so that it can reciprocate in relation to base 100. A square-shaped opening 106 is provided in cover 102 for plugging on IC package 104 in and out of the socket as shown in FIG. 13. When the cover 102 moves in the vertical direction in relation to the base 100, the corner sections 106a at the four corners of this opening 106 are guided by two exterior surfaces 108a of four guides 108, respectively, which are positioned on the base 100.

The top surface of the base 100 is constructed so that a QFP (Quad in line Flat Package) type IC package 104 can be mounted. The respective two interior surfaces 108b of each of the guides 108 are slanted and cone-shaped grooves 108c, which somewhat widen relative to a direction taken towards the base, are formed in their corner sections. The corner sections of the IC package 104 are guided by means of these groove 108c. Also, L-shaped ribs 110 are provided on the base 100, coming close to the base ends of the grooves 108c. The IC package 104 is positioned on the top surface of the base by means of these ribs 110. Multiple contacts 112, which correspond to the row of lead terminals on each side of the IC package 104, are provided in a row on the base 100, between two adjacent guides 108.

With reference to FIGS. 15 and 16, contacts 112 can be made by punching thin plates, for example, of beryllium bronze and such. There is a base end section 112a which is embedded in the base 100, a circular spring section 112b which extends from the upper end section of this base end section 112a in a curved (generally semi-circular) manner, a lever section 112c which extends in a straight line from the upper edge of this circular spring section 112b upward, a lead presser 112d which extends almost horizontally in the direction toward the central section of the socket (the IC package mounting section) from the upper edge of the circular spring section 112b, and a hook-shaped contact section 112e which is formed on the front end of this lead presser 112d. Socket terminal pins 112f protrude straight down from the lower edge of the base end section 112a.

The front end 112g of the lever section 112c normally is in contact with and abuts the slanted sliding contact surface 114a of the cam section 114 which protrudes from the bottom surface the cover 102. When the cover 102 moves downward as shown in FIG. 15 in relation to the base 100, the front end 112g of the lever section 112c follows the slanted sliding contact surface 114a of the cam section 114, thereby causing the lever section 112c to displace towards the outside of the socket. A dividing wall 114b is provided on the slanted sliding contact surface 114a for guiding both sides of lever section 112 and for preventing contact with the adjacent contact 112 .

The operation of each section of contacts 112 during the mounting of an IC package 104 in this socket is set forth below.

First, in the state wherein the IC package 104 is not mounted, the cover 102 is moved by pressing it onto the base 100. By this means, the cam section 114 of the cover 102 moves downward, whereas the lever section 112c, which is in sliding contact with the slanted sliding contact surface 114a is displaced outward from the center of the socket. The circular spring section 112b is displaced in the same direction as the lever section 112c with its arc being slightly contracted. That is, the upper edge of the circular spring section 112b and the bottom edge of lever section 112c sag slightly. Correspondingly, the contact section 112e on the front end of the lead presser 112d is displaced toward the outside of the socket while rising upward. In this state, wherein the contact sections 112e of the contacts 112 are withdrawn diagonally upward from a lead holding surface 116, the IC package 104 can be passed through the opening 106 from above the cover 102 and mounted into this socket. The IC package 104 is guided to the base 100 by the grooves 108c of the interior corner sections of the guides 108 and is positioned on the base 100 by the ribs 110. By this means, the front end bent sections of the leads 104a of the IC package 104 are placed in designated positions on the lead holding surface 116 on the base 100. The state wherein the IC package 104 is installed in this socket in this manner is shown in FIG. 16.

Next, the cover 102 is released so that it is not pressed down against the base. When this is done, owing to the resilient biased force of the circular spring sections 112b of the contacts 112, the cover 102 rises to the original position. The contacts 112 then almost recover their original shape, with the front end contact sections 112e of the lead pressers 112d pressing down on the front end bent section of the lead 104a of the IC package 104. By this means, the recovery of the contact 112 is restricted only by the thickness of the lead 104a with the lead presser 112d slightly bowed, and by means of the elastic force of this lead presser 112d and the circular spring section 112b, the front end contact section 112e is pressed into engagement with the front end bent section of the lead 104a. In FIG. 15, the state is shown wherein an electrical connection is established between the IC package 104 and the socket. The dividing wall 118 is positioned on the lead holding surface 116 of the base 100 so that the contact sections 112e of the contacts 112 do not come into contact with those of the adjacent contacts 112.

In order to remove the IC package 104 from this socket, the cover is again depressed toward base 100 with the front end contact sections 112e of the contacts 112 being withdrawn from the leads 104a of the IC package 104. The IC package 104 then can be removed by means of a pair of tweezers or the like.

The above-mentioned prior art socket accomplishes the installation and removal of IC packages 104 from these sockets by displacing the contacts 112 using a reciprocating cam mechanism made up of the cam section 114 of the cover 102 and the lever section 112c of the contact 112. In this conventional socket the force of pushing down the cover 102 (the operating force) necessary for displacing the contacts 112 from the position in FIG. 15 to the position in FIG. 16, is determined by the elastic force of the lever sections 112c based on the circular spring sections 112b of the contacts 112, the angle of inclination of the cam section 114 of the cover 102, and the angle of friction of the slanted sliding contact surface 114a of the cam section 114 with the front end of the lever 112g. For example, in the case wherein the elastic force of the lever section 112c is 30 gf, the angle of inclination of the cam section 114 is 60 degrees and the friction angle is 15 degrees, the operating force which is necessary for one contact 112 would be 22 gf.

However, because multiple contacts 112 are provided in sockets of this type which correspond to the leads (pins) of electrical components such as the above-mentioned IC package 104, the operating force which is necessary for all of the contacts 112 becomes a value which is much greater. This operating force is obtained by multiplying the number of all the contacts by the operating force that is necessary for one contact 112. Additionally, as the degree of integration of the IC chips has increased, the number of leads (pins) of IC packages has also increased and the pitch between leads has generally decreased. Therefore, in the sockets of this conventional type, the operating force for the entire socket has become much larger, and its operation has become more difficult, whether it is automatically or manually operated.

To address this problem, diminishing the operating force in these conventional sockets has been tried by means of extending the lever section 112c of the contact 112, reducing the elastic force of the lever section 112, and increasing the angle of the cam section 114 of the cover 102. However, if these actions are pursued, then there is the problem that the amount of cover 102 movement increases, and/or the outer dimensions of the socket are increased. Also, if the lever section 112c of the contact 112 is extended, there is the risk that the contact 112 will become easily bent and will "short out" against adjacent contacts.

SUMMARY OF THE INVENTION

Accordingly, this invention provides for a socket which can easily achieve a reduction of the operating force and properly handle the increase of the number of leads (pins) and narrower pitches in electrical components.

Briefly, in accordance with the invention, a connection assembly having first and second connection members is provided, the first connection member having one end pivotably mounted on the base of a socket, the second connection member having first and second end portions and being pivotably connected at the first end portion to the first connection member, the second end portion being disposed adjacent one of a contact element of the socket and a terminal of an electrical component received in the socket and being movable into and out of engagement with the one of a contact element and a terminal and means to move the first connection member between a first position in which the second end portion of the second connection element is in engagement with the one of the contact element and the terminal and a second position in which the second end portion of the second connection element is out of engagement with the one of the contact element and the terminal. According to a first embodiment the first connection member is a generally L-shaped lever rotatably mounted on the base of the socket and in turn rotatably mounting a second connection member which together form a revolute pair. The second connection member engages the contact elements when a cover received over the base is depressed, moving the lever and in turn moving the contact elements away from the terminal leads of the electronic component. In a second embodiment the contact elements of socket are formed with a portion extending laterally away from the contact section of the contact elements with the second connection member received under the laterally extending portion. In accordance with a feature of the invention the rotatable mounting of the first connection member may be used to move the connection assembly by means of a motor attached to the shaft providing the rotatable mounting. According to another feature a plurality of sockets can be driven simultaneously by interconnecting these shafts through suitable means such as bevel gears. In accordance with another embodiment the second connection member comprises first and second sections or links. The first section is rotatably connected to the cover and to the first connection member. The second section is connected through a slot to the rotatable connection of the first section of the cover and to a rotatable connection to the base. The second connection member is adapted to engage the contact elements while the first connection member is formed with an electrically insulating presser section adapted to engage the terminal leads. The first connection member and the first section and the first and second sections form respective revolute pairs. In accordance with yet another embodiment the second connection member is provided with a slot which receives therein a pin attached to the base. The second connection member functions as a latch which moves into and out of engagement with the top surface of the electrical component leads in cooperation with a cam which in one position allows the contact elements to engage the terminal leads on the opposite side of the latch and in another position cams the contact elements away from the terminal leads.

DESCRIPTION OF THE DRAWINGS

Other objects, advantages and details of this invention appear in the following detailed description of the preferred embodiments of the invention, the detailed description referring to the drawings in which:

FIG. 15 is an enlarged partial cross-sectional view which shows the construction of the main sections of the prior art socket with contacts of the socket engaging the leads of an inserted electrical component; and FIG. 16 is an enlarged partial cross-sectional view similar to FIG. 15 with the contacts of the socket in the open position.

DETAILED DESCRIPTION OF THE PREFERRED EMBODIMENTS

Various embodiments of the present invention will be described below with reference to FIGS. 1-12.

Figure 1:
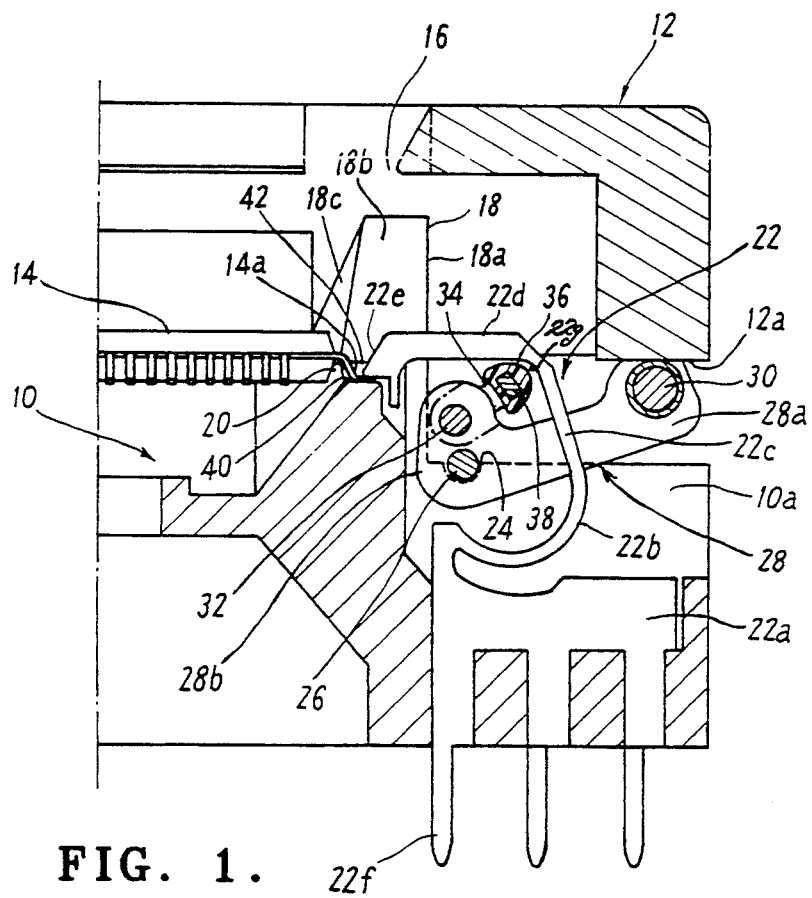
FIG. 1 is an enlarged partial cross-sectional view which shows the main sections of a socket of the present invention with contact elements of the socket engaging the leads of an inserted electrical component.
Figure 2:
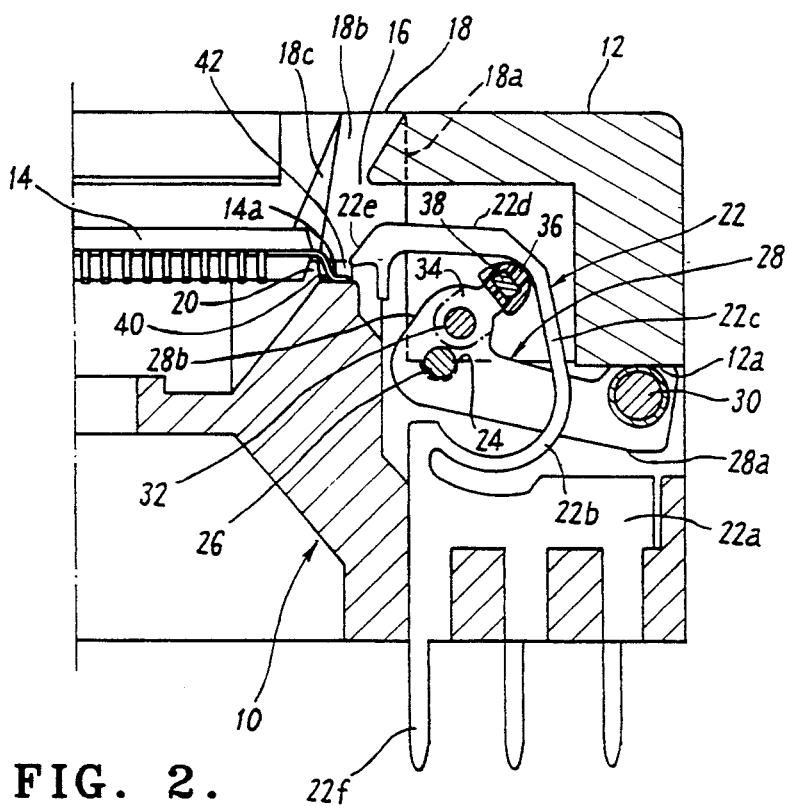
FIG. 2 is an enlarged partial cross-sectional view similar to FIG. 1 with the contact elements of the socket in the open position.

FIGS. 1 and 2 are enlarged partial cross-sectional views which show the main sections of a socket of the present invention. This socket has a base 10 that serves as the socket main body, which is adapted to be affixed on a printed-circuit board (not shown in the FIGS.), and a cover 12 which is provided so that it reciprocates in relation to base 10. A square-shaped opening 16 is provided in the cover for inserting an IC package 14 in and out of a seat formed in base 10 of the socket. When the cover 12 moves in the vertical direction in relation to base 10, the corner sections in the four corners of this opening 16 are guided by the two exterior surfaces 18a of the four guides 18, respectively, which are set on the base 10.

The top surface of the base 10 serves as a seat which is constructed so that it is possible to mount a QFP type IC package 14. The respective two interior surfaces 18b of each of the guides 18 are slanted surfaces and cone-shaped grooves 18c which somewhat widen relative to a direction taken towards the base are formed in the corner sections. The corner sections of IC package 14 are guided by grooves 18c. Also, L-shaped ribs 20 are provided on base 10 adjacent to the base edges of each of the grooves 18. IC package 14 is positioned on the top surface of the base by ribs 20. Multiple contact elements 22, which correspond to rows of lead wire terminals on each side of IC package 14, are provided in rows on base 10 between two adjacent guides 18.

Contact elements 22 typically are made from a resilient material such as beryllium bronze or the like. The contacts have a base end section 22a which is embedded in base 10, a circular spring section 22b which extends from the upper end of base end section 22a in a curved manner, a straight spring section 22c which extends diagonally from the upper end of circular spring section 22b upward generally in a direction toward the seat or central area of the socket (the IC package mounting section), a lead presser 22d which extends laterally almost horizontally in the direction of the central area of the socket from the upper end of the straight spring section 22c, and a contact section 22e which is formed on the front end of lead pressor 22d. Socket terminal pins 22f protrude straight down from the bottom edge of base end section 22a.

Semicircular concave bearing sections 24 are formed in the base wall surface 10a on both sides of each row of contacts, and a rotatable shaft 26 is supported by these concave bearing sections 24. A connection assembly comprises a first connection member, L-shaped lever 28 and a second connection member 34. Lever 28 is affixed to rotatable shaft 26. Shafts 30, 32 are also provided and affixed to the ends of a long arm section 28a and a short arm section 28b of lever 28, respectively. A lever pressing surface 12a, which is made up by the outer bottom surface of the cover 12, is placed aligned with and in contact with shaft 30 of long arm section 28a. The second connection member 34 is attached to shaft 32 of short arm section 28b to be freely rotatable. A push rod 38 which is covered by an insulating body 36 typically of plastic and other resin materials is provided at the front end of connection member 34 parallel to the row of contact elements. Push rod 38 is positioned aligned with a curved or bent section 22g between straight spring section 22c of contact 22 and lead presser section 22d. In such a connection assembly the short arm section 28b of the lever 28 and the connection member 34 form a revolute pair.

The operation of mounting an IC package in the socket will be described below.

Cover 12 is pressed downwardly onto base 10 from the position in FIG. 1. By pressing the cover toward the base, the lever pressing surface 12a of the cover 12 moves downward, lever 28 rotates clockwise with rotatable shaft 26 as the center point of rotation, and the shaft 30 serves as the force transfer point. This movement of lever 28 causes the front end of connection member 34 to come into engagement with the bent section 22g of contact element 22 and the shaft 32 moves clockwise so that the distance between shaft 26 and the tip of the connection member 34 widens, and push rod 38 pushes the straight spring section 22c of contact element 22 and the lead presser 22d upward. By this means, the contact section 22e on the front end of the lead presser 22d is also raised upwardly.

In this state, the contact sections 22e of the contact elements 22 are withdrawn diagonally upward from a lead holding surface 40 and the IC package 14 is passed through the top opening 16 of cover 12 and is mounted on the base of the socket. That is, IC package 14 is guided to the base 10 by the grooves 18c of the interior corner sections of guides 18, and is positioned on base 10 by ribs 20. By this means, the front end bent sections of each of the terminal leads 14a of IC package 14 are placed in a designated position on the lead holding surface 40 on base 10 (as shown in FIG. 2).

Next, cover 12 is released so that it does not press down against the base. When this is done by means of the resilient force (the restitutive force) of the circular spring sections 22b of contact elements 22, shaft 32 moves in the counterclockwise direction so that the distance between the front end of the connection member 34 and the shaft 26 is narrowed, the lever 28 rotates counterclockwise, and cover 12 rises, being lifted up to the original position. The contact members 22 essentially recover their original shape with the front end contact section 22e of the lead presser 22d pressing down the front end bent sections of lead 14a of the IC package 14. By this means, the recovery of the contact element 22 is restricted only by the thickness of lead 14a, and by the elastic force of lead presser 22d, straight spring section 22c and circular spring section 22b. In FIG. 2 the state is shown wherein an electrical connection is established between IC package 14 and this socket. A dividing wall 42 extends from a lead holding surface 40 of base 10 so that contact sections 22e of contact elements 22 do not come into contact with those of the adjacent contact elements 22.

In order to remove IC package 14 from the IC socket, cover 12 once again is depressed onto the base 10 and the front end contact sections 22e of contact elements 22 are withdrawn from leads 14a of IC package 14 thereby allowing IC package 14 to be easily removed by a pair of tweezers or the like.

As was described above, the pushing force of the cover serves as the operational force and the connection mechanism which comprises base 10, cover 12, shaft 26, lever 28, shafts 30, 32, connection member 34 and push rod 38. The push rod is covered with insulation and serves to position the contact elements 22 for the mounting or the removal of IC package 14. The operating force, which is necessary for displacing the contact elements 22 from the position in FIG. 1 to the position in FIG. 2, can be set at an appropriate value by appropriately choosing the positions of shafts 26, 30, 32, and the lengths of lever 28 and connection member 34.

Figure 3:
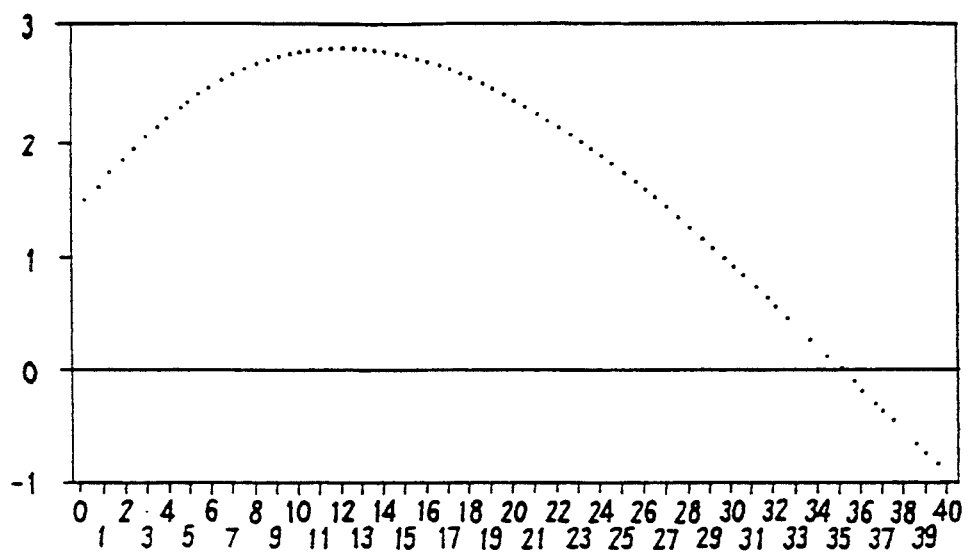
FIG. 3 is a figure which shows the operating characteristics of the socket of FIG. 1.

FIG. 3 shows the relationship between the angle of rotation of lever 28 and its operating force. Specifically, the figure shows where the distance between the center of shaft 26 and the front end of connection member 34 has been changed from 2.336 mm to 2.713 mm, the distance from the center of shaft 26 to the center of shaft 30 is 6 mm, the distance from the center of shaft 32 to the front end of connection member 34 is 1.6 mm, and where friction was not taken into consideration. Also, the elastic force of the contact elements 22 is made to be 100 gf when the contact elements 22 are withdrawn from the socket outwardly. As shown in FIG. 3, the operating force makes a curve which is upwardly convex; and after passing the maximum value (approximately 3 gf), the curve gradually decreases and approaches zero.

Thus, the socket of this example has an operating force which is necessary per contact element 22 of 3 gf at the maximum, which is a significant decrease in comparison with the conventional sockets. Correspondingly, the operating force for the entire socket with all the contact elements is also small as compared to conventional sockets. Therefore, it is possible to obtain small operating forces without increasing the size of the socket and/or contact elements and the configuration of cover 12, while still meeting the requirements of an increase in the number of pins and/or narrowing pitch in electrical components. Also, since the contact elements of the present invention are bent very little, there is limited risk of contact shorting between adjacent contact elements.

Figure 4:
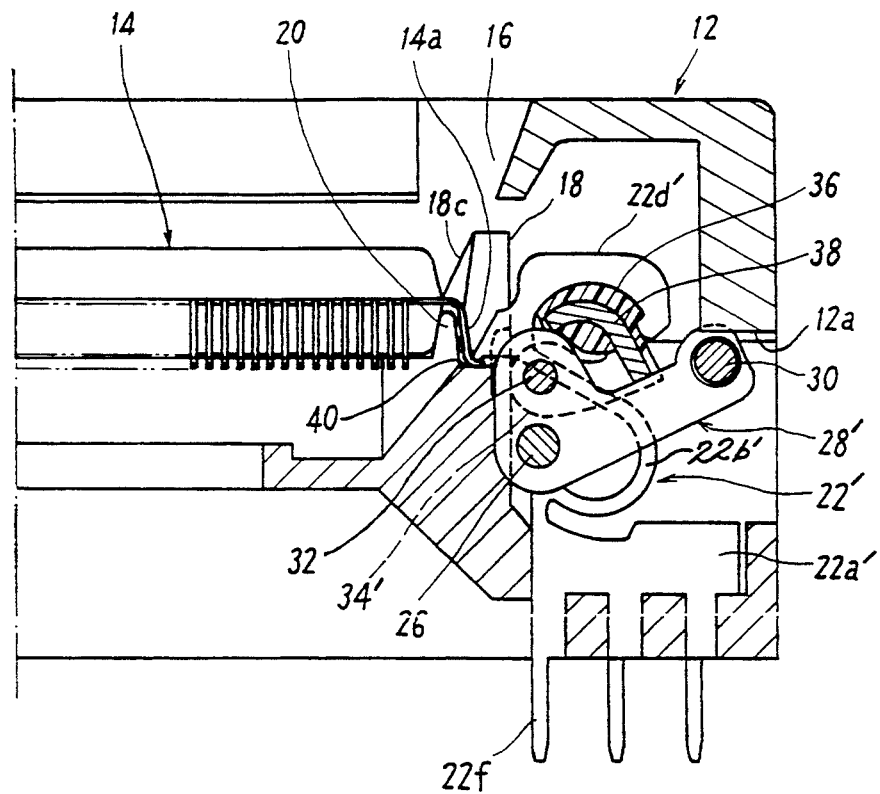
FIG. 4 is an enlarged partial cross-sectional view which shows the main sections of a second embodiment of a socket of the present invention with contact elements of the socket engaging the leads of an inserted electrical component.
Figure 5:
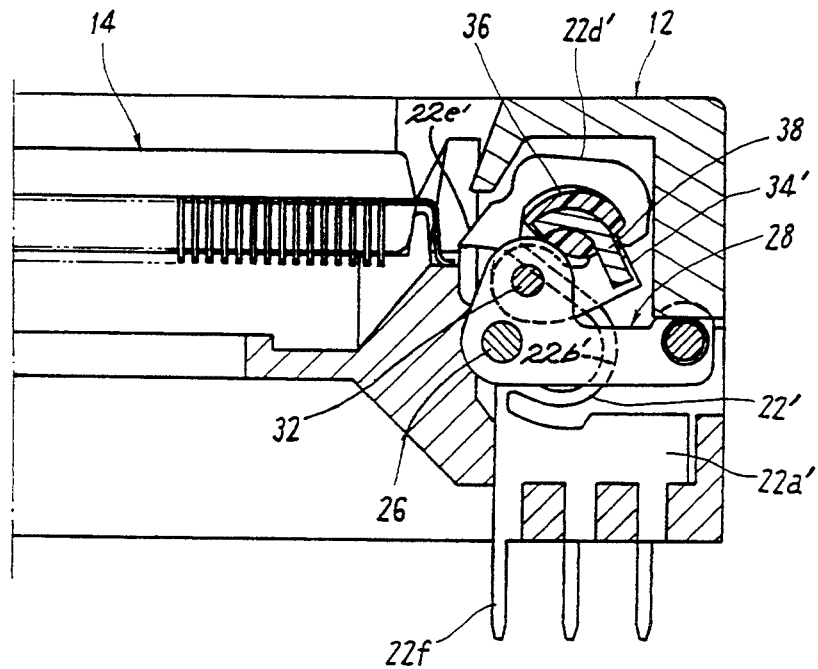
FIG. 5 is an enlarged partial cross-sectional view similar to FIG. 4 with the contact elements of the socket in the open position.

FIGS. 4 and 5 show a second embodiment of a socket of the present invention. FIG. 4 shows the state wherein the contact elements 22' are in engagement with the terminal leads 14a of the IC package 14, and FIG. 5 shows the state wherein the contact elements 22' are withdrawn from terminal leads 14a.

In this second embodiment, the shape of the contact elements 22' and the connection assembly 34' is modified so as to make the operating force required even smaller. The straight spring section 22c' of the contact element 22' extends from the upper edge of the circular spring section 22b' into the vicinity of the lead holding surface 40, and the contact section 22e' is formed at the front end of straight spring section 22c'. Then, lead presser 22d' extends laterally almost horizontally from the front end of the straight spring section 22c' away from the lead holding surface 40. The distal end of the lead presser 22d' is bent downwardly, its bottom edge having a smoothly curved shape, and the front end of the connection member 34' conforms to and is received in this curved section. As shown in FIG. 5, the front end of the connection member 34' pushes the contact elements 22' upwardly and to the right in the figure, with the rear section of the lead presser 22d' serving as a force transfer point or an operating point. In such a mechanism, the length of the arm needed for displacing the contact element 22' is determined only by the length of the lead presser 22d', therefore a diminished operating force is required.

The connection assembly can be actuated with the push force of the cover 12 or in the alternative, it is also possible to actuate the connection mechanism by means of a rotary motion power source acting through the medium of the shaft 26.

Figure 6:
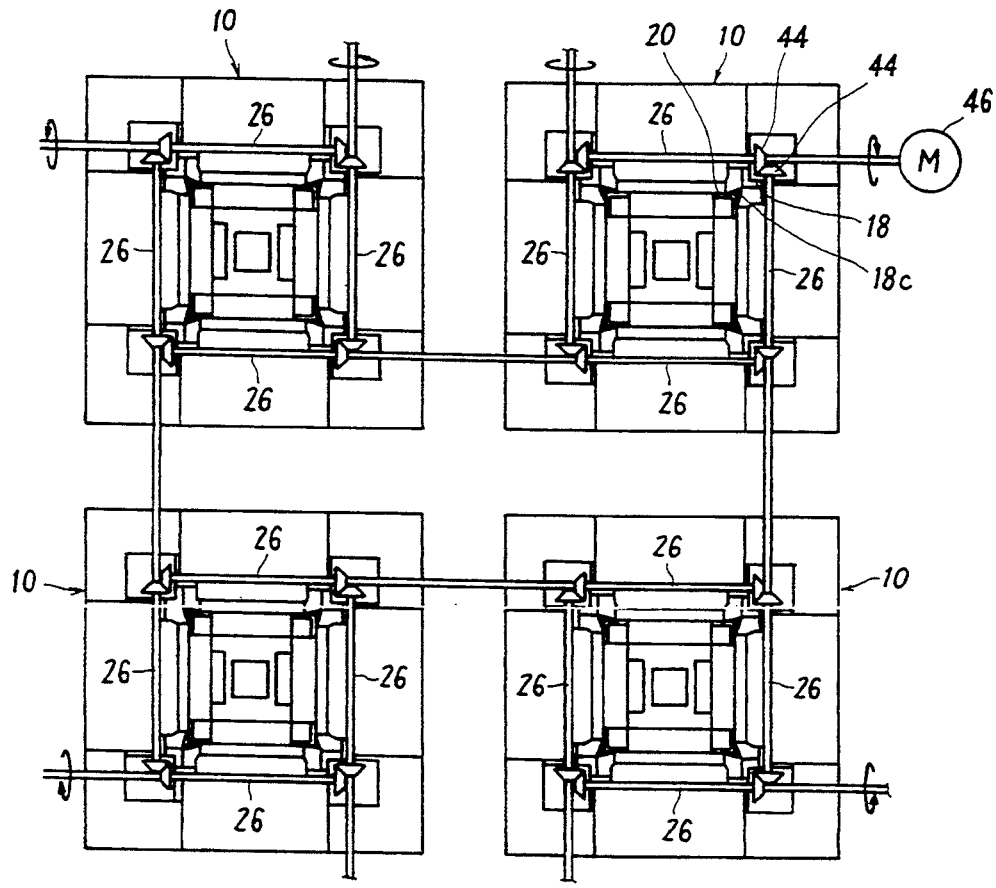
FIG. 6 is a schematic plan view which shows the construction of a driving mechanism of the present invention.

FIG. 6 shows an example of a driving mechanism for simultaneous actuation of connection mechanisms of multiple sockets based on a rotary motion power source system. The rotating shaft 26, which is affixed to the lever 28 or 28' (not shown in the figure), is connected to the adjacent rotating shaft 26, which is at right angles to it, through a bevel gear 44. Furthermore, the rotating shaft 26 is extended outside from the socket and is made common with the rotating shaft 26 of the adjacent socket. Then, a driving motor 46 is connected to the extension line of either of the rotating shafts 26. In such a mechanism, all of the rotating shafts 26 of all of the sockets are rotated by means of rotary driving force of the motor 46 and the connection assemblies are actuated all at once. By this means, the mounting of IC packages 14 can be performed simultaneously in multiple sockets. Also, because of the pressing force of the cover is not necessary, the cover can be eliminated. In this arrangement, the shaft 30 and the long arm section 28a of the lever 28 can also be eliminated, thereby allowing the lever 28 to be small.

Figure 7:
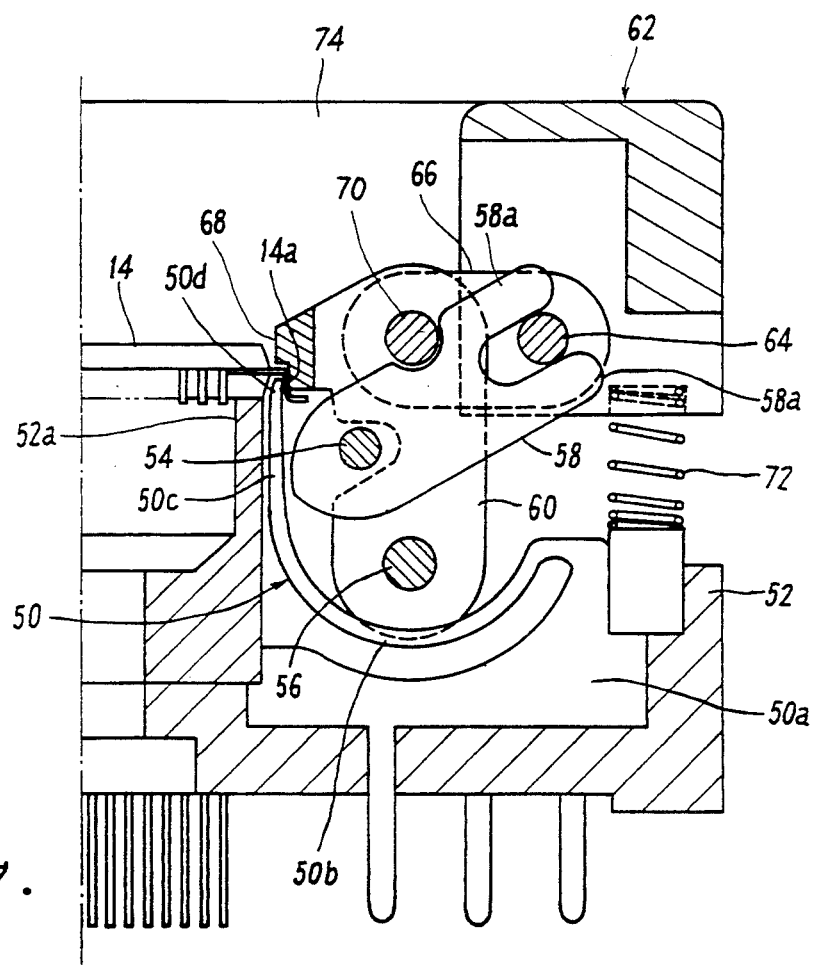
FIG. 7 is an enlarged partial cross-sectional view which shows the main sections of a third embodiment of a socket of the present invention with contact elements of the socket engaging the leads of an inserted electrical component.
Figure 8:
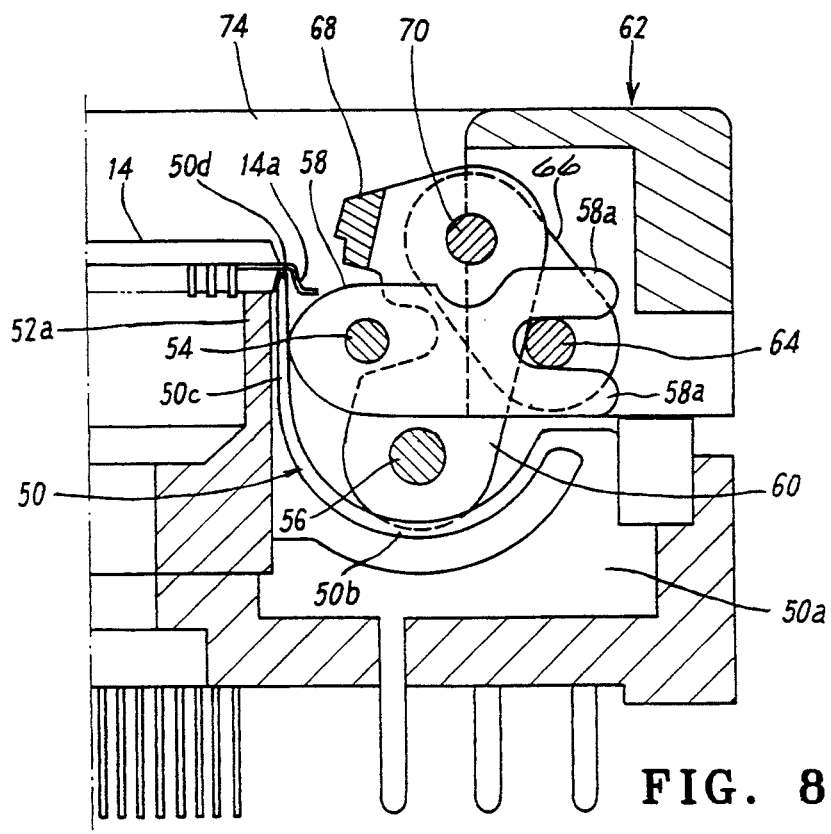
FIG. 8 is an enlarged partial cross-sectional view similar to FIG. 7 with the contact elements of the socket in the open position.

FIGS. 7 and 8 are enlarged partial cross-sectional views which show the main sections of a socket in a third embodiment of this invention. In this socket the contact element 50 has a base end section 50a, which is embedded in the base 52, a circular spring section 50b which extends in a curved manner from the upper edge of this base end section 50a in the direction of the central section of the socket, a straight spring section 50c which extends from the upper edge of this circular spring section 50b upward in the direction of terminal lead 14a of IC package 14, and a contact section 50d which is formed on the distal end or upper edge of this straight spring section 50c. As shown in FIG. 7, contact section 50d is positioned opposite lead 14a to make electrical engagement with the lead.

In order to operate the contact elements 50 in each and every row all at once, a connection assembly of the following construction is provided in the socket of this embodiment.

Shafts 54, 56 are affixed to the base 52, a link 58 is attached to one end (left end as shown in FIG. 7) to the shaft 54 so that it can rotate, and a link 60 is attached to one end (bottom end) of the shaft 56 so that it can rotate. The other opposite end (right end as shown in FIG. 7) of link 58 branches into two legs 58a, and a shaft 64 which is affixed to a cover 62 is engaged in the slot created by the two legs 58a. A lead presser 68, which is made of an electrically insulating material such as plastic or the like is affixed to the other end of link 60, along with a shaft 70. A link 66 is attached at one end to shaft 64 to be freely rotatable. Link 66 is attached at the other end (the left end) to shaft 70 to be freely rotatable. A compression coil spring 72 is provided between the cover 62 and the base 52. In such a connection assembly, link 58 and link 66 form a revolute pair through the medium of the shaft 64, whereas link 60 and link 66 form a revolute pair through the medium of the shaft 70. Link 60 serves as a first connection member and links 66 and 58 serve as first and second portions respectively of a second connection member.

The operation of this socket will be set forth below.

When, in the state wherein the IC package 14 is not mounted, cover 62 is pressed down from the position in FIG. 7 towards base 52 against opposing coil spring 72 which causes link 58 to rotate clockwise with the shaft 64 as the rotation point. The rotation of link 58 causes its engagement with straight spring section 50c of the contact element 50 and displaces it towards a package holding section 52a of the base 52. Additionally, due to the downward movement of shaft 64, link 66 rotates clockwise in relation to the shaft 64. Shaft 70 moves clockwise integrally with link 66 resulting in link 60 rotating clockwise with the shaft 56 as the center, and the lead presser 68 being withdrawn from the contacting section 50d of the contact element 50.

In this state the contact section of the contact element 50 is biased against the lead holding section 52a and the lead presser 68 is withdraw so that IC package 14 can be plugged into this socket through the opening 74 in cover 62. Then IC package 14 is positioned on base 52 using a positioning means (not shown in the figure) as shown in FIG. 8. In this position, contact section 50d of contact element 50 is not in contact with lead 14a.

Next, cover 62 is released and the resilient force of coil spring 72 causes the connection assembly to move in the direction which is opposite to that above-mentioned and returns to the state which is shown in FIG. 7. In this state, lead presser 68 at the front end of link 60 comes into engagement with the middle section of the bend of the lead 14a from one side and the contact section 50d of contact element 50 comes into engagement with the middle section of the bend of terminal lead 14a from the other side. In order to remove IC package 14 from the socket, cover 62 can be pressed towards the base 52 again.

In the socket of the third embodiment of the present invention, the mounting and removal of IC package 14 is also performed by displacing the contact element 50 by means of the connection assembly, and the operating force needed to displace the contact elements is small as in earlier embodiments. Also, connecting the shaft 54 to a source of rotary motive power is also possible as shown in FIG. 6 with regard to the earlier embodiments.

The socket in the embodiments described above used QFP type IC packages which have leads that are curved in a gull wing form. However, this invention can also be applied to sockets intended for IC packages of the type which have straight leads and can also be applied to electrical components besides IC packages. The sockets of this invention can be used for any purposes wherein electrical components are plugged in and out such as burn-in, functional checks, and the like.

Figure 9:
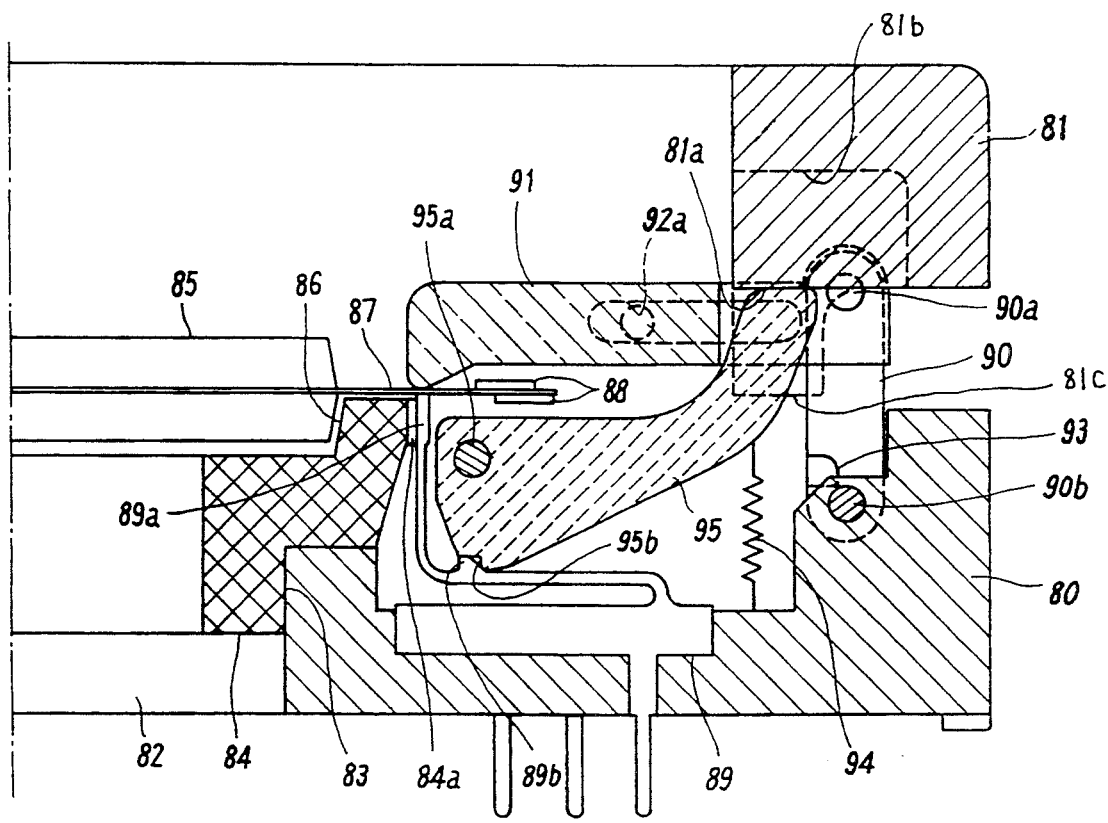
FIG. 9 is an enlarged partial cross-sectional view which shows the main sections of a fourth embodiment of a socket of the present invention with contact elements of the socket engaging the leads of an inserted electrical component.
Figure 10:
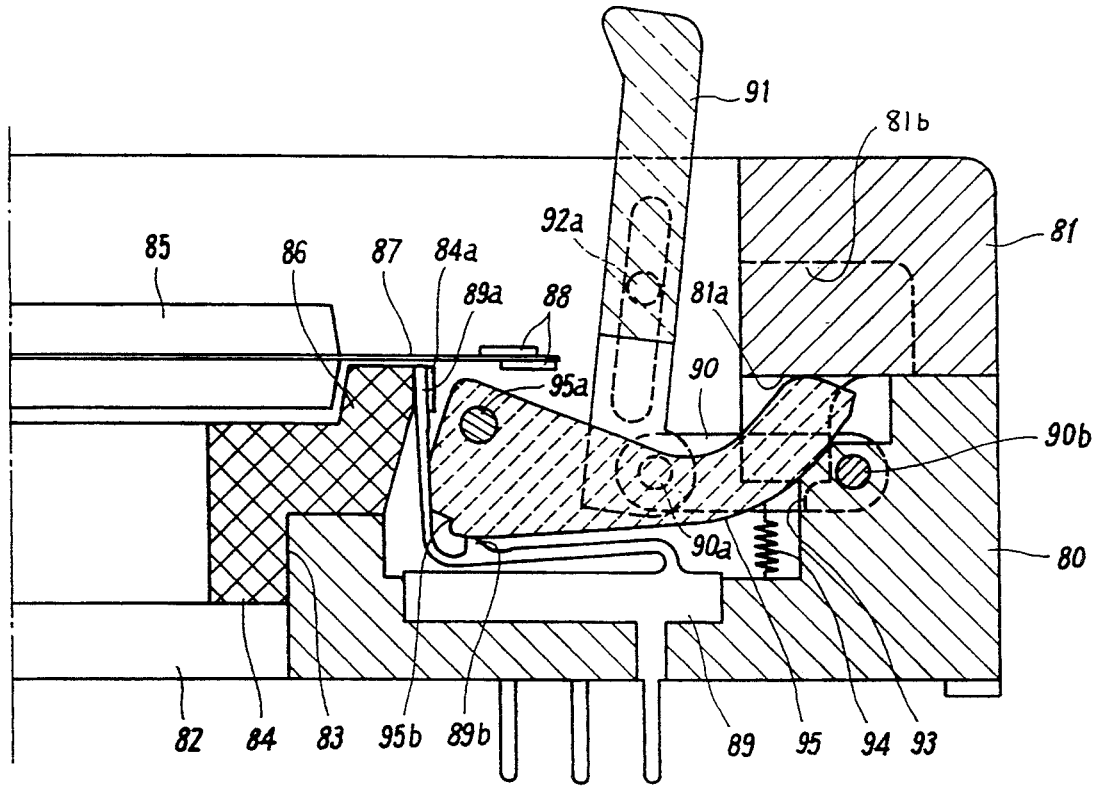
FIG. 10 is an enlarged partial cross-sectional view similar to FIG. 9 with the contact elements of the socket in the open position.

Next, we explain this invention with regard to a fourth embodiment of this invention with reference to FIGS. 9–12. FIG. 9 is a cross-sectional view which shows a state wherein a semiconductor device is mounted in the socket main body and the contact elements are engaged with the device, and FIG. 10 is a figure which shows a state wherein a semiconductor device is about to be mounted or removed from the socket and the contact elements are not engaged with the device.

The socket in this embodiment also uses a connection assembly in the same manner as in the above-mentioned embodiments. The socket has a main body equipped with a base 80 which makes up its foundation and a cover 81 which is movable in the upward and downward directions in relation to base 80. An opening 82 is formed in the central section of base 80 and an adaptor 84 is attached to a stepped section 83. Along with the opening which is formed in the center of adaptor 84, an angled section 86 is provided which corresponds to the shape of a semiconductor device 85 which is to be mounted to position and hold it in place. Adaptor 84 will be selected in accordance with the shape or the type of semiconductor device 85. The semiconductor device 85 in this example is a flat package (FPAC) from which protrudes multiple terminal leads 87 extending outwardly with bands 88 at the front ends of the leads for preventing misalignment thereof. Bands 88 are made, for example, of polyamide resins, and adhered to leads 87 by means of adhesive agents. The semiconductor device 85, which is shown mounted in the socket, is in the state before lead molding and the bands 88 are cut off after lead molding.

Multiple contact elements 89 are attached to base 80 corresponding to the row of the leads 87 of the semiconductor device 85. Front end contact sections 89a are at the distal end of a curved, L-shaped section that extends from base sections. The front end contact sections 89a are the portion of the contact elements that come into engagement with the leads 87. Also, the front end contact sections 89a are positioned to be biased against the side wall of the adaptor 84 and electrically insulating walls 84a are formed on the side wall of the adaptor 84 in accordance with the order of the contact elements. The insulating walls isolate the front end contact sections 89a of the contact elements from one another.

Figure 11:
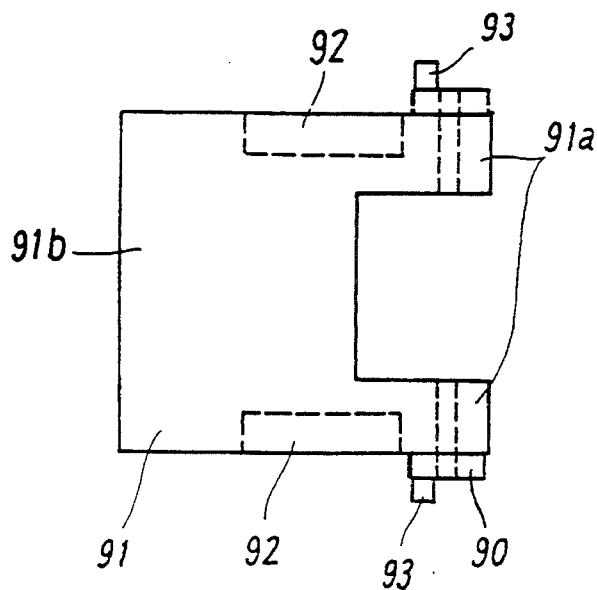
FIG. 11 is a plan view which shows the construction of the rotating component and the latch in the socket of FIG. 9.
Figure 12:
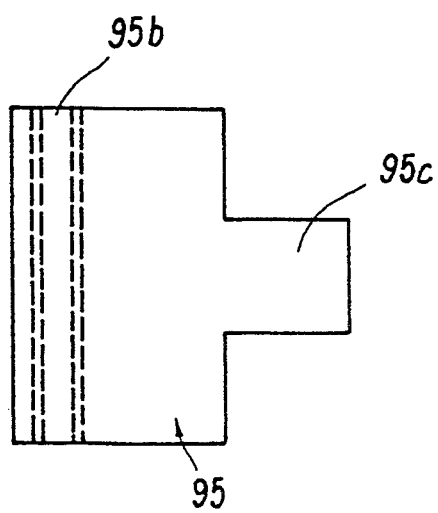
FIG. 12 is a plan view which shows the construction of the cam of the socket of FIG. 9.
Figure 13:
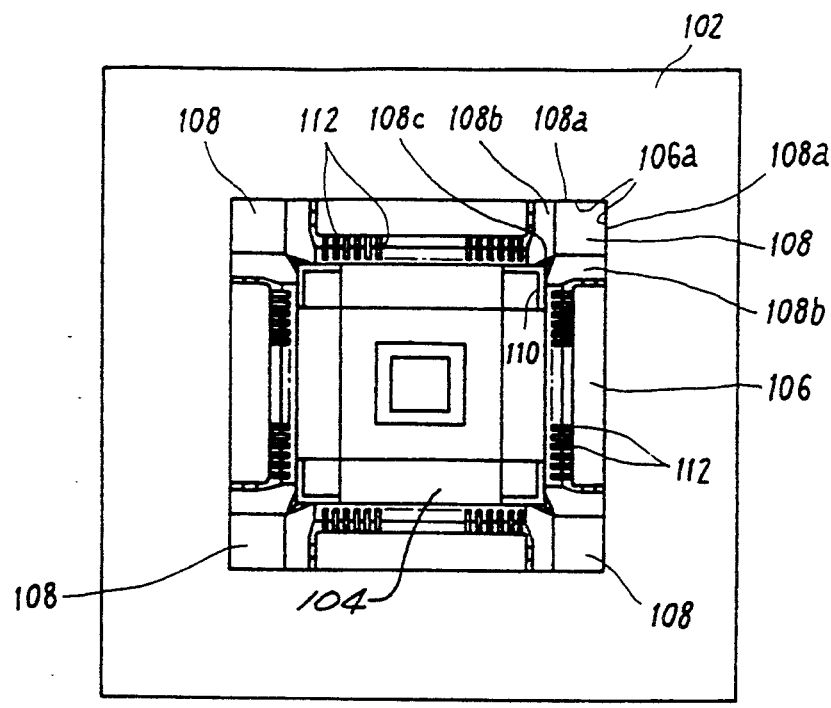
FIG. 13 is a plan view which shows the construction of a prior art socket.
Figure 14:
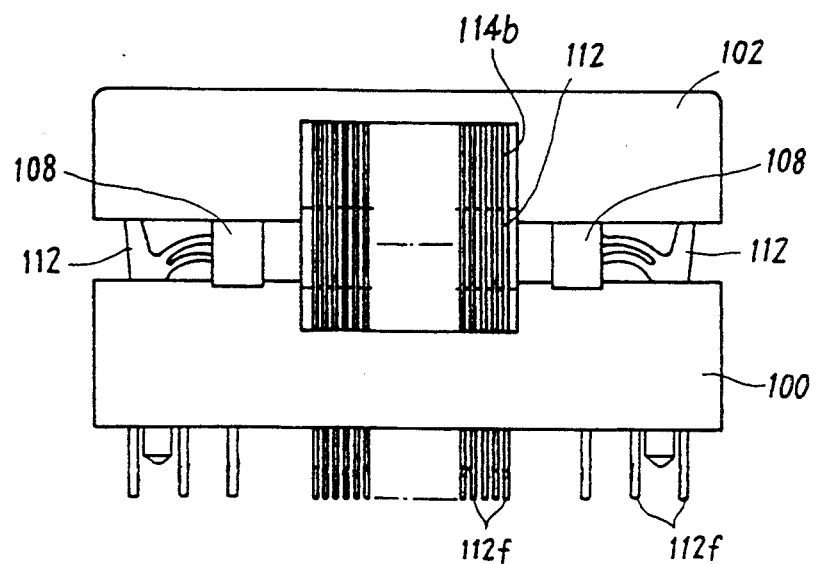
FIG. 14 is a side view which shows the construction of prior art socket.

The opening and closing mechanism in this embodiment includes a rotatable component 90, a latch 91, and a cam 95. FIG. 11 is a plan view of the rotating component 90 and the latch 91 and FIG. 12 is a plan view of the cam 95. The latch 91 is generally C-shaped with grooves and a pair of long slots 92 formed on both of its sides. Pins 92a, which are affixed to the base 80, are held in the pair of long slots 92 so that they can slide in the slots. One end 91a of the latch 91 is attached so that it can rotate by means of the rotatable component 90 which is located outside it and the shaft 90a. The other end 91b of the latch 91 has a flat face which corresponds to the orientation of the arrangement of the contact elements 89 so as to clamp the leads 87 between the front ends contact sections 89a of the contact elements 89 when the contact elements 89 are closed.

The rotatable component 90 has the shape of a rod, as was described above; one end of it is attached to the latch 91 by means of the shaft 90a and the other end is attached to the base 80 by means of the shaft 90b so that it can rotate. A spring (omitted in the figure) is wound on the shaft 90b on the diameter of this shaft, constantly spring-loading the rotatable component 90 in the clockwise direction. Also, a protrusion 93, which protrudes in the direction of the thickness of the rod, is formed in the position adjacent to the shaft 90b.

The cam 95 is located under the latch 91, and is rotatably attached to the base 80 by means of the shaft 95a. A cut-out section 95b which extends in the direction of this shaft is formed on the bottom of the cam 95. This cut-out section 95b engages with the protrusions 89b which are formed so that they protrude from the curved sections of the contact elements 89, and the contact elements 89 are displaced by means of rotation of the cam 95. Also, the width of the end section 95c of the cam 95 is narrow, and a spring component 94 for constant spring loading of the cam 95 in the counterclockwise direction is provided between end section 95c and base 80. By means of the resilient force of spring component 94, end section 95c of the cam 95 is positioned exactly inside the groove between ends 91a of latch 91, and simultaneously comes into contact with bottom surface 81a of cover 81.

Cover 81 is attached to base 80 which is equipped with the assembly described above. Grooves 81b are formed in the cover 81 on both sides of the area which is aligned with end 91a of the latch 91 and the rotatable component 90. That is, the area with which the end section 95c of the cam 95 comes into contact. Thus, when the cover 81 is moved towards the base 80 an escape is formed so that the cover does not interfere with end 91a of the latch 91 and the rotatable component 90. Also, in the outer section which is adjacent to the groove 81b of the cover 81, in the area which is aligned with the protrusion 93 of the rotating component 90, a presser 81c is formed extending in the direction toward the base, and when the cover 81 is caused to move towards the base 80, the front end section of this presser 81c comes into contact with the protrusion 93. In this embodiment rotatable links or components 90 serve as the first connection member and latch 91 serves as the second connection member.

The operation of the socket will be explained below. First, when cover 81 is moved towards base 80 from the state shown in FIG. 9, cam 95 which is in engagement with the bottom surface 81a of cover 81 rotates against the force of the spring component 94. By means of the rotation of cam 95, protrusion 89b is removed from cut-out section 95b and slides on the bottom of cam 95. By means of this operation, contact 89 is displaced in the counterclockwise direction, and terminal leads 87 are released from the clamp between the front end contact sections 89a of the contact elements 89 and the latch 91. Furthermore, when the cover 81 is pressed, the presser section 81c of the cover 81 comes into contact with the protrusion 93 of the rotatable component 90 and thereafter, the rotatable component 90 starts rotating in the counterclockwise direction opposite the force of the spring by shifting cover 81. When rotatable component 90 rotates so that it falls down, latch 91 rotates in the clockwise direction with pin 92a as a spindle sliding in the groove. When cover 81 is made to move to the point of engagement with base 80, the rotatable component 90 rotates counterclockwise through almost 90 degrees and latch 91 rotates clockwise through almost 90 degrees, respectively. Also, front end contact section 89a of the contact element 89 is displaced downwardly to almost the same height as the upper surface of the adapter 84, and this brings about the state which is shown in FIG. 10. The mounting and removal of the semiconductor device 85 is performed in this state wherein the contact elements 89 are in this open position.

On the other hand, when a force that presses cover 81 in the state which is shown in FIG. 10 is eliminated, cam 95 starts rotating in the counterclockwise direction by means of the resilient force of spring component 94, and cover 81 is lifted back up because it is spring loaded by end section 95c on its bottom surface 81a. Along with the rising of the cover 81, the presser 81c is separated from the protrusion 93 of rotatable component 90, the rotatable component 90 rising by means of the spring force of the spring which is wound on the shaft 90b; and as a result of these movements, latch 91 rotates and slides so as to assume a horizontal position which is the state which is shown in FIG. 9.

As was described above, the socket of this invention is constructed so that contact elements are displaced by means of a connection assembly, and the mounting and removal of electrical components is performed by means of appropriately selecting the parameters of the connection assembly. By the use of the connection assembly, it is possible to greatly reduce the operating force as well as to obtain different values of the operating force so that the requirements put forth by the increased number of pins and narrower pitches can be easily met.

This invention has been described above with reference to the aforementioned embodiments. It is evident, however, that many alternatives, modification and variations will be apparent to those skilled in the art in light of the foregoing description. Accordingly, it is intended to embrace all such alternative, modifications and variations as fall within the spirit and scope of the appended claims.

We claim:

1. Socket apparatus for mounting an IC package having a plurality of terminals, the socket apparatus comprising a base, a seat formed on the base for mounting an IC package thereon, the socket having a plurality of contact elements mounted on the base, the contact elements each having an arm having a contact section movable into and out of engagement with a respective terminal of an IC package when mounted on the seat, a connection assembly having first and second connection members, the first connection member having one end rotatably mounted on the base, the second connection member having first and second end portions and being rotatably connected at the first end portion to the first connection member, the second end portion being disposed adjacent one of said plurality of contact elements and said plurality of terminals and being movable into and out of engagement with the one of said plurality of contact elements and said plurality of terminals and means to move the first connection member between a first position in which the second end portion of the second connection member is in engagement with the one of the contact element and the terminal and a second position in which the second end portion of the second connection member is out of engagement with the one of the contact element and the terminal.

2. Socket apparatus for mounting an IC package having a plurality of terminals, the socket apparatus comprising a base, a seat formed on the base for mounting an IC package thereon, the socket having a plurality of contact elements mounted on the base, the contact elements each having an arm having a contact section movable into and out of engagement with a respective terminal of an IC package when mounted on the seat, a connection assembly having first and second connection members, the first connection member having one end rotatably mounted on the base, the second connection member having first and second end portions and being rotatably connected at the first end portion to the first connection member, the second end portion being disposed adjacent one of said plurality of contact elements and being movable into and out of engagement with the one of said plurality of contact elements and means to move the first connection member between a first position in which the second end portion of the second connection member is in engagement with the contact element and a second position in which the second end portion of the second connection member is out of engagement with the contact element, and a cover disposed over the base and movable toward and away from the base, the first connection member being generally L-shaped having a relatively short arm and a relatively long arm each having a free distal end, the first connection member being rotatably mounted to the base intermediate the distal ends of the first and second arms, the free distal end of the long leg being disposed adjacent the cover and being movable downwardly by engagement with the cover when the cover is moved downwardly toward the base, the second connection member being rotatably connected at its first end portion to the distal free end of the short leg, the first and second connection members forming a revolute pair with the second portion of the second connection member extending back toward the free distal end of the long arm.

3. Socket apparatus according to claim 2 in which each of the contact elements has a base portion and is formed with a first curved portion extending from the base portion away from the seat to a lateral position which extends toward the seat to a contact section and the second portion of the second connection member is disposed below the lateral portion.

4. Socket apparatus according to claim 2 in which the contact element each has a base portion and is each formed with a first curved portion extending from the base away from the seat to another portion extending toward the seat to a contact section and a lateral portion extends from the contact section away from the seat and the second portion of the second connection member is disposed below the lateral portion.

5. Socket apparatus according to claim 1 further including a cover disposed over the base and movable toward and away from the base and in which the second connecting member is formed of first and second links each having ends, the first link being rotatably connected to the cover through a shaft at a first end of the first link, the second end of the first link being rotatably connected to another end of the first connecting member, the second link having a slot formed between two legs at one end with the shaft received in the slot, the second link being rotatably mounted to the base adjacent the second end of the second link, the second end of the second link being the second end portion of the second connecting member and the second end of the first link being the first end portion of the second connecting member, the first connecting member and the first link forming a revolute pair and the first and second links forming a revolute pair.

6. Socket apparatus according to claim 5 in which a terminal presser portion is formed on the first connection member adjacent the said another end and is movable into and out of engagement with a respective terminal, the terminal presser portion being formed of electrically insulative material, and the respective terminal is disposed between the presser portion and the contact section.

7. Socket apparatus according to claim 1 in which the first connection element is fixed to a shaft which is rotatably mounted in the base and the means to move the first connection element comprises a motor coupled to the shaft.

8. Socket apparatus according to claim 1 including a plurality of socket apparatus in which the first connection member of each fixed to a shaft, the shaft of each socket apparatus being interconnected with each other and the means to move the first connection member comprises a motor coupled to one of the shafts.

9. Socket apparatus according to claim 1 further including a cover disposed over the base and movable toward and away from the base and in which one of a slot and a pin is provided in the second connection member and the other of the slot and pin is provided in the cover, the pin being slidable in the slot.

10. Socket apparatus according to claim 9 further including a cam member having two opposite ends, one end being rotatably mounted to the base, the other end being disposed beneath the cover and being movable when the cover is moved, the cam being formed with a cam surface adapted to engage the contact elements and displace the contact sections from the terminals when the cover is moved toward the base.

11. Socket apparatus according to claim 10 in which a protrusion is formed on the first connection member and a presser section is formed on the cover aligned with the protrusion and is adapted to engage the protrusion and rotate the first connection member when the cover is moved toward the base.

12. A socket comprising a base, a plurality of contact elements mounted on the base adapted to be elastically pressed into contact with a plurality of terminal leads of designated electrical components which are mounted on a seat formed in the base and a connection assembly which is provided so that it can reciprocate, moving in response to designated external forces, the connection assembly comprising first and second connection members, the first conection member being rotatable about a fixed location on the base, the second connection member being rotatably mounted to the first connection member and movable between a first position in engagement with one of the plurality of contact terminal leads and the plurality of contact elements and a second position out of engagement with the said one of the plurality of contact terminal leads and the plurality of contact elements and means to move the second connection member between teh first and second positions so that in the second position mounting of the electrical components onto the seat or removing them from the seat by displacing the contact elements from their original positions while interlocking with the forward movement of the connection assembly is effected and the contact elements return to the original positions while interlocking with the return movement of the connection assembly bringing the contact elements into engagement with the contact terminal leads of the electrical components which is plugged into the body.

13. A socket comprising a base, a plurality of contact elements mounted on the base adapted to be elastically pressed into contact with a plurality of terminal leads of designated electrical components which are mounted on a seat formed in the base and a connection assembly which is provided so that it can reciprocate, moving in response to designated external forces, the connection assembly comprising first and second connection members, the first connection member being rotatable about a fixed location on the base, the second connection member being rotatably mounted to the first connection member and movable between a first position in engagement with one of the plurality of contact elements and a second position out of engagement with the said one of the plurality of contact elements and means to move the second connection member between the first and second positions so that in the second position mounting of the electrical components onto the seat or removing them from the seat by displacing the contact elements from their original positions while interlocking with the forward movement of the connection assembly is effected and the contact elements return to the original positions while interlocking with the return movement of the connection assembly bringing the contact elements into engagement with the contact terminal leads of the electrical component which is plugged into the body., and a cover disposed over the base and movable toward and away from the base, the first connection member being generally L-shaped having a relatively short leg and a relatively long leg, each having a free distal end, the first connection member being rotatably mounted to the base intermediate the distal ends of the first and second legs, the free distal end of the long leg being disposed adjacent the cover and being movable downwardly by engagement with the cover when the cover is moved downwardly toward the base, the second connection member being rotatably connected at a first end portion to the distal free end of the short leg, the first and second connection members forming a revolute pair with a second portion of the second connection member extending back toward the free distal end of the long leg.

14. A socket according to claim 12 in which each of the contact elements has a base portion and is formed with a first curved portion extending from the base away from the seat to a lateral portion which extends toward the seat to a contact section and a portion of the second connection member is disposed below the lateral portion.

15. A socket according to claim 12 in which the contact elements each have a base portion and is formed with a first curved portion extending from the base away from the seat to another portion extending toward the seat to a contact section and a lateral portion extends from the contact section away from the seat and a portion of the second connection member is disposed below the lateral portion.

* * * * *